(12) United States Patent
Harshavardhan et al.

(10) Patent No.: US 6,632,282 B2
(45) Date of Patent: Oct. 14, 2003

(54) PLANETARY MULTI-SUBSTRATE HOLDER SYSTEM FOR MATERIAL DEPOSITION

(75) Inventors: Kolagani S. Harshavardhan, Silver Spring, MD (US); Jeonggoo Kim, Laurel, MD (US)

(73) Assignee: Neocera, Inc., Beltsville, MD (US)

( * ) Notice: Subject to any disclaimer, the term of this patent is extended or adjusted under 35 U.S.C. 154(b) by 1 day.

(21) Appl. No.: 09/961,082

(22) Filed: Sep. 24, 2001

(65) Prior Publication Data

US 2003/0059557 A1 Mar. 27, 2003

(51) Int. Cl.$^7$ .................................................. C23C 14/00
(52) U.S. Cl. .................... 118/500; 118/730; 204/298.27
(58) Field of Search .............................. 118/730, 500, 118/503; 204/298.27

(56) References Cited

U.S. PATENT DOCUMENTS 3,608,519 A * 9/1971 Bean et al. ................. 118/725
3,633,537 A * 1/1972 Howe ......................... 118/725
4,626,336 A * 12/1986 Bloomquist et al. ... 204/298.27
4,650,064 A * 3/1987 Slabaugh .................. 198/631.1

* cited by examiner

Primary Examiner—Richard Bueker
(74) Attorney, Agent, or Firm—Rosenberg, Klein & Lee

(57) ABSTRACT

A planetary multi-substrate holder system for material deposition includes a substrate holder having circumferentially shaped openings in which disk-like substrates of a smaller diameter than the diameter of the openings are maintained. Upon rotation of the substrate holder, either in a vertical plane, or in a horizontal plane, the substrates self-rotate within each opening due to either gravity force (for vertically rotated substrate holder), or due to centrifugal force (for horizontally rotated substrate holder) applied to the substrates. The planetary multi-substrate system obviates the need for mechanical individual gears to rotate substrates for material deposition, and, as a sequence, yields an extended service life of the system, as well as agreeability with high temperatures used in material deposition process, and reduced cost of a final product.

8 Claims, 4 Drawing Sheets

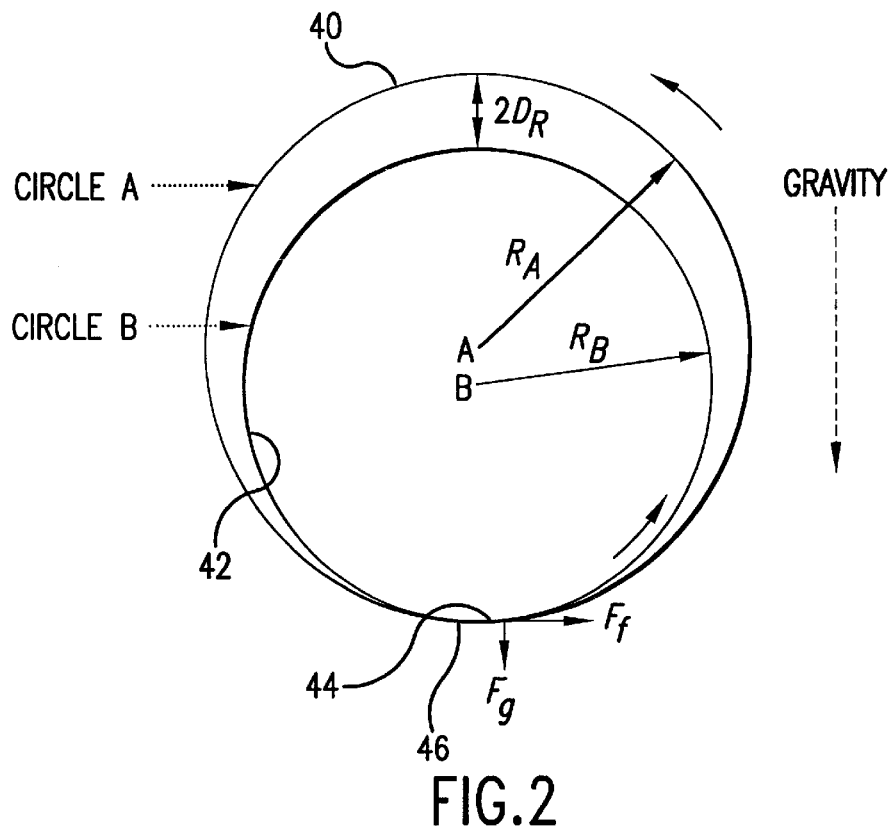
FIG.2
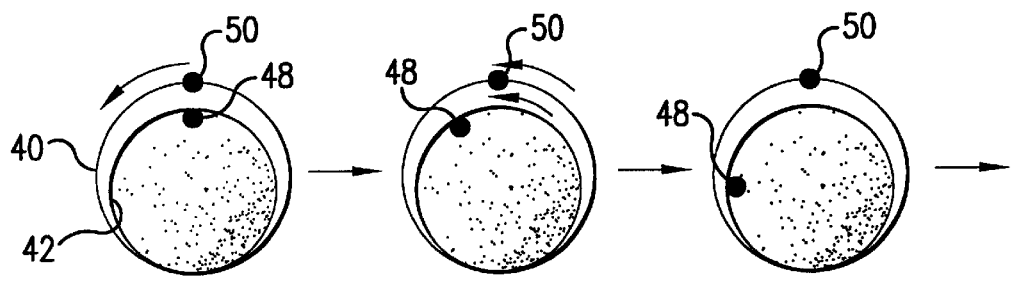
BEFORE ROTATING
FIG.3A
AFTER 1 TURN
FIG.3B
AFTER 2 TURNS
FIG.3C
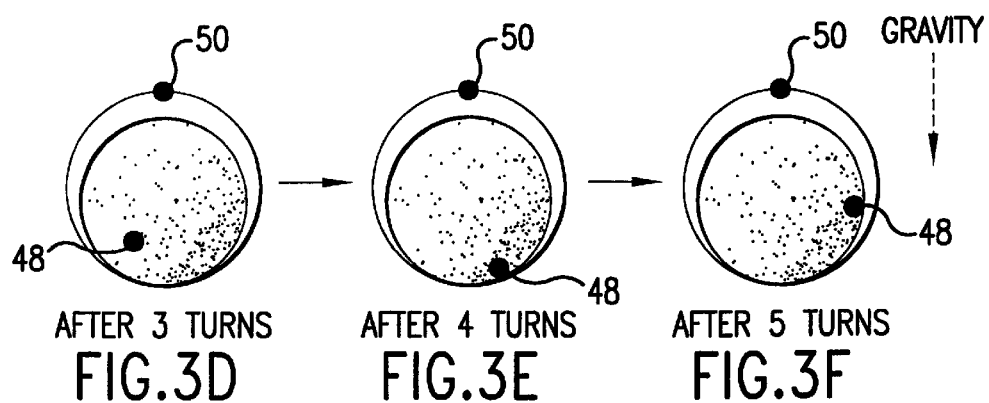
AFTER 3 TURNS
FIG.3D
AFTER 4 TURNS
FIG.3E
AFTER 5 TURNS
FIG.3F

PLANETARY MULTI-SUBSTRATE HOLDER SYSTEM FOR MATERIAL DEPOSITION

FIELD OF THE INVENTION

The present invention relates to material deposition; and more particularly, to a planetary type multi-substrate holder system for pulse laser deposition.

Particularly, the present invention relates to a gearless substrate holder capable of withstanding high temperatures, common for material deposition processes, and free of failures associated with mechanical malfunctions of geared substrate holders.

Additionally, the present invention relates to a multi-substrate holder having a plurality of circularly shaped openings in each of which an individual substrate is held and self-rotated once the multi-substrate holder is driven to rotate in either the vertical or horizontal plane. When the multi-substrate holder is rotated vertically, each substrate is self-rotated by gravity assist. When the multi-substrate holder is rotated in horizontal plane, each substrate is self-rotated due to centrifugal forces applied thereto and created by rotation of the multi-substrate holder.

BACKGROUND OF THE INVENTION

Typically, conventional planetary substrate holders employ mechanical gears to which substrates are attached and by which the substrates are rotated for material deposition thereon. The mechanical gears constitute a "bottle-neck" area of the material deposition systems since they often develop mechanical malfunctions as a result of continuous use. Additionally, they are vulnerable to high temperature processes typical in material deposition processes. In addition to a limited lifetime and problems associated with high temperature applications, the conventional geared substrate holders have relatively high inventory cost since an individual mechanical gear is needed for each substrate holder.

It is therefore highly desirable in the material deposition art, especially for pulse laser deposition, to provide a multi-substrate holder which does not need a gear for each substrate rotation.

SUMMARY OF THE INVENTION

It is therefore an object of the present invention to provide a planetary gearless multi-substrate holder with an extended lifetime which easily withstands high temperature applications and results in lowering the final product cost due to the increase of production speed of a material deposition process.

It is another object of the present invention to provide a gearless substrate holder having a plurality of circumferentially shaped openings of a predetermined diameter in each of which a substrate of circular shape is maintained and self-rotates due either to gravitational or centrifugal forces applied to the substrates when the substrate holder is driven to rotate either in the vertical or horizontal planes, respectively.

It is a further object of the present invention to provide a method for material deposition by using a multi-substrate holder with a plurality of openings defined therein in each of which a substrate self-rotates without a mechanical gear and relies on gravity assist or centrifugal force applied to the substrates when the multi-substrate holder is rotated.

Although the present invention may find its utility in a variety of systems for material deposition, the specific usefulness of the present invention is foreseen in the area of pulse laser deposition. In accordance with the teachings of the present invention, a planetary multi-substrate holder system includes a substrate holder having a plurality of circumferentially shaped openings of a first diameter, a mechanism for rotating the substrate holder about the center of rotation thereof, and an annularly shaped element attached to the sample holder at each of the openings and extending along the peripheral thereof. Preferably, the openings defined within the substrate holder are equidistantly spaced along the circumference of the substrate holder.

Circularly shaped substrates of a diameter smaller than the diameter of each opening are positioned within the openings and held therein by the annularly shaped elements with a portion of the contour of each substrate in contiguous contact with a respective portion of the contour of an opening. Such contiguous contact between the contours of the substrate and the opening is maintained either by gravitational force applied to the substrate, when the substrate holder rotates in the vertical plane; or by centrifugal force applied to the substrate from the center of rotation of the substrate holder when the latter rotates in the horizontal plane.

It is of importance that there is a ledge extending in coinciding relationship with the contour of each opening in order that the respective portion of the contour of each substrate leans or abuts against the ledge when the substrate holder rotates. When the substrate holder rotates in vertical direction, a portion of the contour of each substrate presses against the lowermost portion of the contour of the opening. When the substrate holder rotates horizontally, the substrates press against the portion of the contour of the openings the most distant from the center of rotation of the substrate holder.

Each annularly shaped element can be attached to the substrate holder either by fasteners, or, when the annularly shaped elements are made of ferromagnetic metal, they can be secured against the substrate holder by means of a magnet unit positioned at a side of the substrate holder opposite to the annularly shaped elements thus holding the same attached to the substrate holder.

Viewing another aspect of the present invention, there is provided a method for material deposition which comprises the following steps:

positioning a substrate holder at a predetermined location relative to a target containing at least one deposition material where the substrate holder has a plurality of substantially circularly shaped openings of a predetermined diameter, securing substrates in respective openings where each substrate is substantially circularly shaped substrate having a diameter smaller than the diameter of the openings, rotating the substrate holder in either a vertical or horizontal plane to cause self-rotation of each substrate within its respective opening due to the gravitational force applied to each substrate (when the substrate holder is vertically rotated) or due to centrifugal force caused by rotation of the substrate holder in horizontal plane, and directing an energetic beam towards the target to ablate the deposition material(s) therefrom to deposit the same on the self-rotating substrates. It is essential that no scanning of the energetic beam over the surface of the target is needed for the material deposition technique of the present invention and for obtaining high-quality films on the substrates.

BRIEF DESCRIPTION OF THE DRAWINGS

FIG. 2 illustrates the geometric concept for the self-planetary substrate holder system;

FIGS. 3A–3F illustrate schematically the mechanism of self-rotation of a circularly shaped substrate within an opening;

DESCRIPTION OF THE PREFERRED EMBODIMENT

Figure 1:
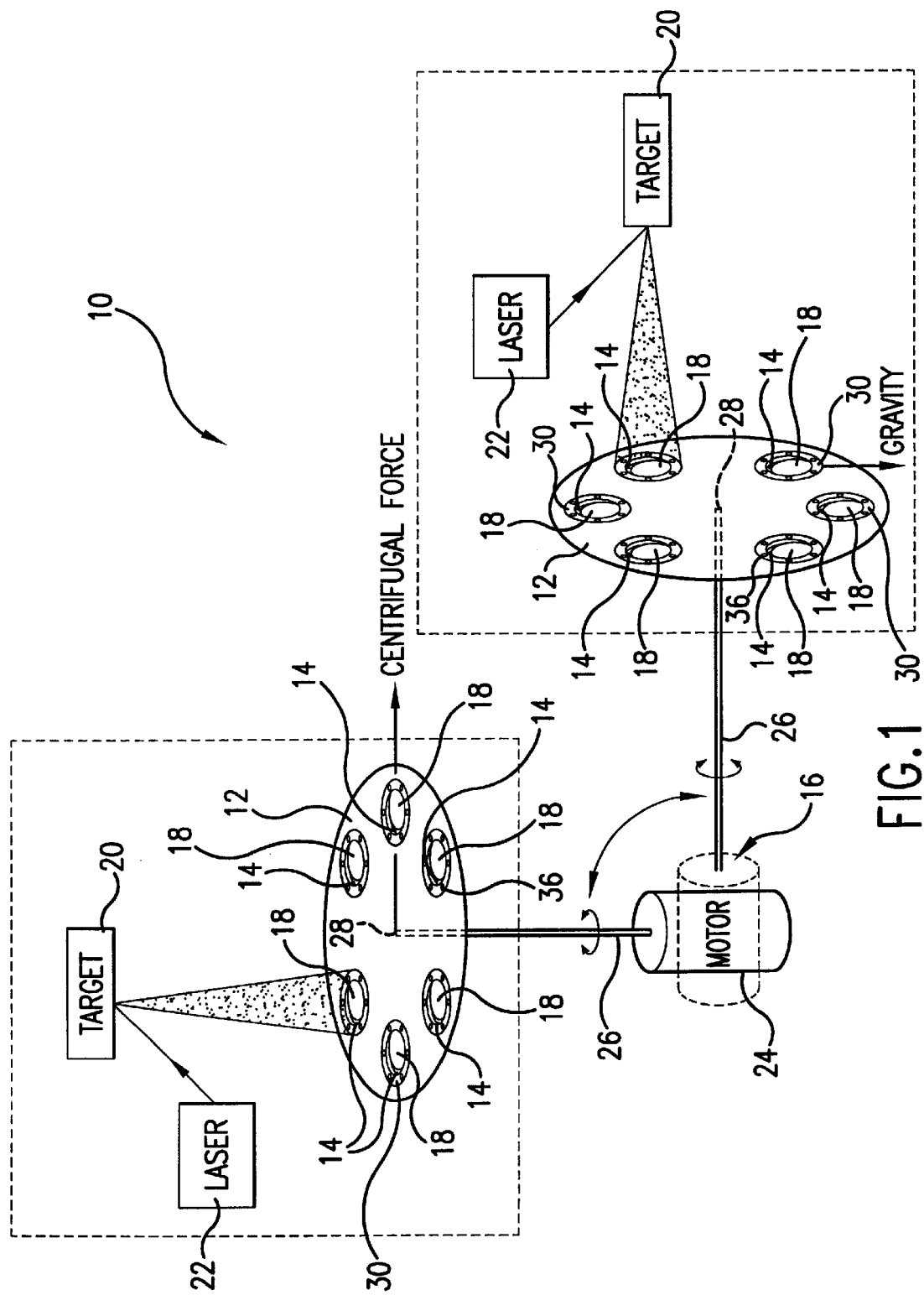
FIG. 1 is a schematic representation of the material deposition system using a gearless planetary multi-substrate holder system of the present invention.

Referring to FIG. 1, a planetary multi-substrate holder system 10 of the present invention is shown for material deposition which includes a substrate holder 12 having a plurality of circumferentially shaped openings 14 formed in the substrate holder 12. A drive mechanism 16 rotates the substrate holder 12. A plurality of substrates 18 are maintained within the openings 14 to be rotatively aligned with a target 20 containing one or more of deposition materials to be deposited onto the surface of the substrates 18. A laser 22 producing a beam which is directed toward the target 20 to ablate the deposition material therefrom and to create a plume directed towards the substrates 18, so that the material can be deposited onto the surface of the substrates 18 as it is known to those skilled in the art.

Although any number of the openings 14 can be defined in the substrate holder 12, the system illustrated in FIG. 1 includes six openings 14 of the same or differing diameters, not important to the inventive concept as herein defined with the exception that the opening 14 be of sufficient diameter to accommodate the substrates 18. In general openings 14 are equidistantly spaced apart along the circumference of the substrate holder 12. The substrate holder can be rotated by mechanism 16 which includes a standard commercially available motor 24 which drives rotational shaft 26 coupled between the motor 24 and the center of rotation 28 of the substrate holder 12 in order to rotate the substrate holder in either a clockwise or counter-clockwise direction. The substrate holder 12 is preferably a substantially circularly shaped holder, in order that the rotational center 28 coincides with its geometric center. As can be seen from FIG. 1, the substrate holder 12 can be rotated either in a vertical plane or in a horizontal plane.

Figure 4:
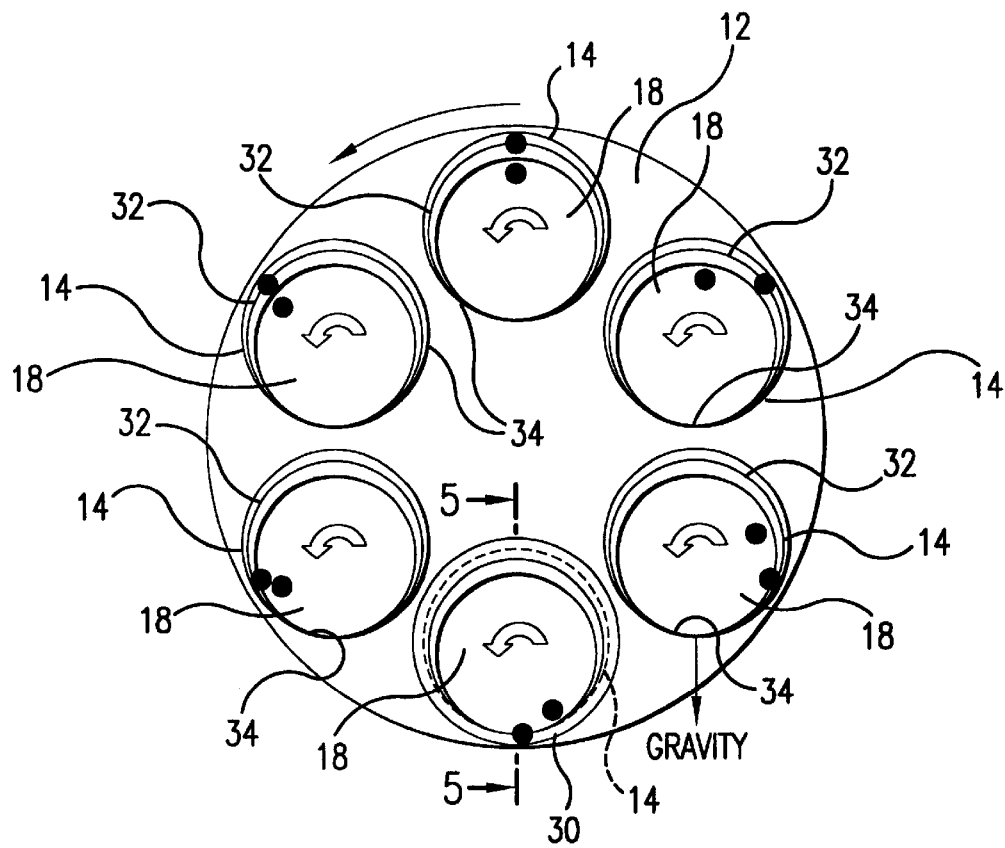
FIG. 4 shows a substrate holder of the present invention with six disk-like substrates.
Figure 5:
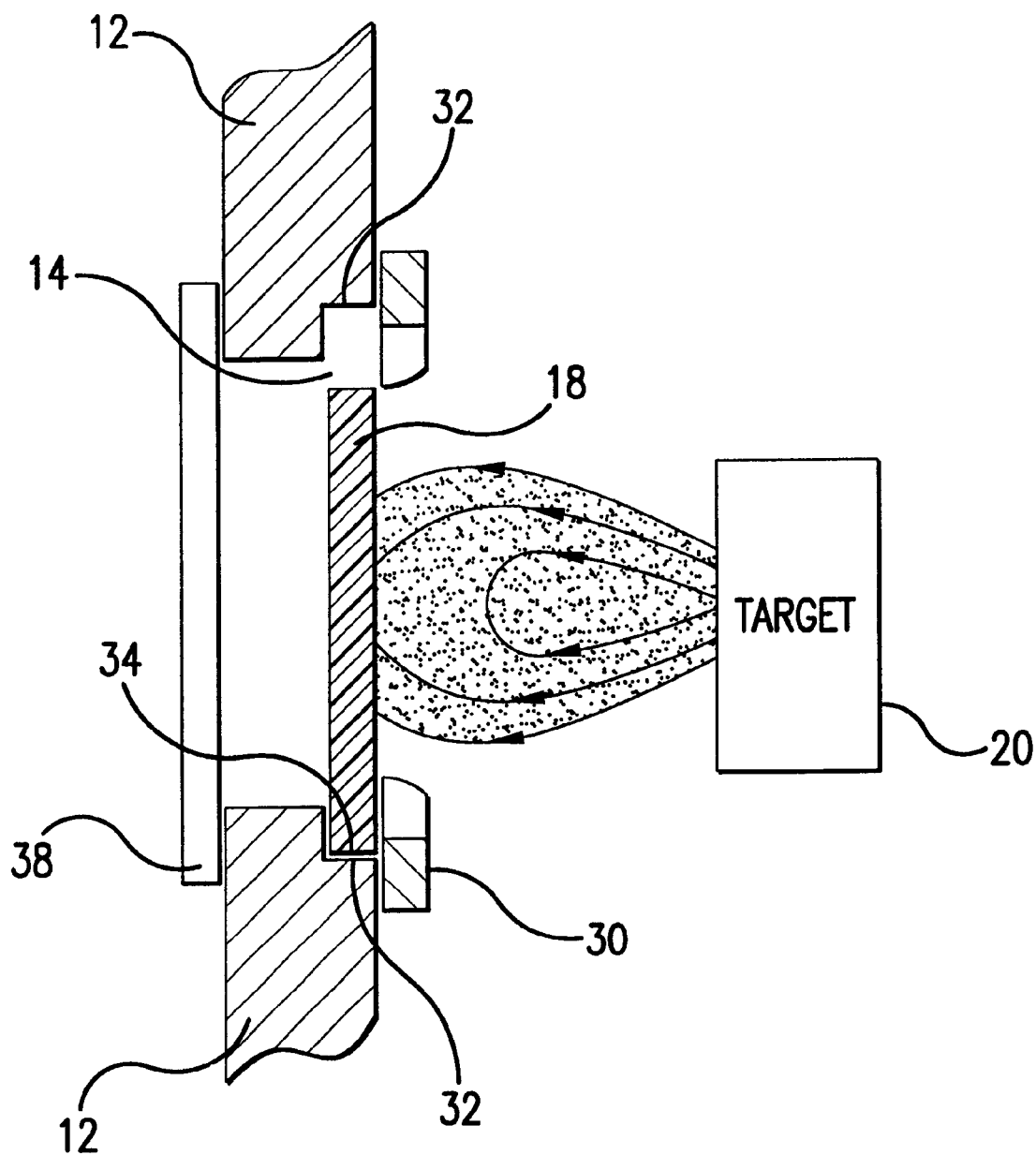
FIG. 5 is a cross-section of the substrate holder of FIG. 4 taken along lines 5—5 thereof; and, FIG. 6 shows a thickness profile for a YSB film deposited on a substrate at 800° C. using the technique of the present invention.

As best shown in FIGS. 1, 4, and 5, in order to hold the substrates 18 within their respective openings 14, a holding mechanism is provided which includes an annularly shaped element 30 attached to each opening coaxially therewith and extending along the contour of each opening 14. As best shown in FIG. 5, each opening 14 is provided with a ledge 32 extending along the contour of the opening so that a portion 34 of the substrate 18 abuts or leans against the ledge. A different portion of the contour of the substrate 18 has a contact with the ledge 32 at each time interval during rotation of the substrate holder. In order to secure the substrate 18 within the ledge 32, the annularly shaped element 30 is attached to the substrate holder 12 either by fasteners 46, as best shown in FIG. 1, or by a mechanism shown in FIG. 5, which includes a magnetic unit 38 positioned at a side of the substrate holder 12 opposite to the position of the annularly shaped element 30. When the annularly shaped element 30 is formed of a ferromagnetic metal, the magnet unit 38 will attract the element 30, thus pressing the same against the substrate holder 12 and securing the annularly shaped element 30 thereto. At each time increment of rotation of the substrate holder 12, a respective portion of the substrate 18 is held between the ledge 32 and the annularly shaped element 30, as best shown in FIG. 5.

The principles of the present invention will now be explained with reference to FIGS. 2–4. With regard to FIG. 2, which represents a geometric concept for the self-planetary multi-substrate holder system 10 of the present invention, the circle 40 is the equivalent of the circumferentially shaped opening 14, and the circle 42 is the equivalent of the substrate 18 of a diameter smaller than that of the circle 40. When the substrate holder is positioned vertically, the lowermost portion 44 of the circle 42 will touch the portion 46 of the circle 40 due to the gravitational force applied to the circle 42. As it will be readily understood by those skilled in the art, combination of the gravitational force $F_g$ (pressing the portion of the circle 42 against the contours of the circle 40) and the friction $F_f$ between the contours of the circles 40 and 42 will cause the circle 42 to roll inside the circle 40. Thus, due to the gravitational force and rotation of the circle 40, a "self-rotation" of the circle 42 is observed during the rotational movement of the circle 40. The rotation angle of the circle 40 is always smaller than the rotational angle of the circle 42 due to the difference in radiances $R_A$ and $R_B$, i.e., the circle 42 rolls faster than the circle 40 rotates.

The difference between the rotation angle of the circles 40 and 42 can be obtained as follows:

the total distance which a mark on a circumference of a circle will travel during one turn of a circle is equal to the circumference of the circle, as shown in equations (1) and (2):

$$L_A = 2\pi R_A \quad (1)$$

$$L_B = 2\pi R_B \quad (2)$$

wherein $L_A$ and $L_B$ are the circumferences of the circles 40 and 42, and $R_A$ and $R_B$ are the radii of the circles 40 and 42.

Defining $D_R$ as the difference between two circles radii, the relationship between the radius of the circles 40 and 42 is as follows:

$$R_A = R_B + D_R \quad (3)$$

Therefore, $$L_B = 2\pi(R_A - R_B) = 2\pi R_A - 2\pi R_D = L_A - 2\pi R_D \quad (4)$$

indicating that $L_B$ is shorter than $L_A$ by $2\pi R_D$.

When the circle 40 rotates one turn, the smaller circle 42 should roll over the equal length of the circumference $L_A$ of the circle 40. Since $L_B$ is smaller than $L_A$, the circle 42 rotates more than 360° to compensate for the difference of $2\pi R_D$. For a 2" diameter disk-like circle 42 placed inside a 2.1" circle 40, for example, $L_A = 6.594"$, $L_B = 6.28"$, and $2\pi R_D = 0.314"$, indicating that the circle 42 should rotate by 378° to compensate for 0.314" when the circle 40 rotates by 360°. Therefore, since at each turn of the circle 40, the circle 42 rotates 18° more, then 20 turns of the circle 40 will result in one complete self-rotation of the circle 42 (in addition to rotation along with the circle 40).

Turning now to FIGS. 3A–3F, showing schematically positions of the inner circle 42 within the outer circle 40 after each turn of the circle 40, it is shown that prior to rotating the circle 40, the position marks 48 (of the circle 42) and 50 (of the circle 40) have zero angular difference therebetween, as shown in FIG. 3A. After one turn of the circle 40, when the mark 50 takes its initial position, the inner circle 42 self-rotates 378° so that, as can be seen in FIG. 3B, there is an angular difference between the marks 48 and 50, which is 18°. After two turns of the circle 40, as shown in FIG. 3C, the angular difference between the marks 48 and 50 will be 36°. The continuous rotation of the circle 40, as shown in sequence in FIGS. 3A–3F, results in self-rotation of the circle 42 inside of the circle 40 which is seen where the identification mark 50 continuously changes the position thereof within the circle 40.

The principles of self-rotation of the circle 42 within the circle 40 presented in the previous paragraphs with regard to FIGS. 2 and 3A–3F, are taken advantage of in the multi-substrate holder shown in FIG. 4, which represents an example of a self-planetary holder for six disk-like substrates 18. Each fall rotation of the substrate holder 12 results in one turn for every circumferentially shaped opening 14; while, for each substrate 18, it will result in one complete turn thereof plus travel distance=$2\pi R_D$, as shown in FIG. 2.

Referring again to FIGS. 1, 4, and 5, during self-rotation, the portion 34 of the substrate 18 is held between the substrate holder 12 and the annularly shaped elements 30 and abuts or leans against the ledge 32. For a gravity based multi-substrate holder of the present invention, i.e., when the substrate holder rotates in the vertical plane, as shown in FIG. 1, a portion of the substrate 18 will always be in contiguous contact with the lowermost portion of the contour of each opening 14.

If however, the substrate holder 12 rotates in the horizontal plane, as also shown in FIG. 1, with the speed of rotation of the substrate holder 12 being dependent upon deposition parameters of the laser 22, target 20 and substrate size, it is the centrifugal force (not the gravity), which creates a contiguous contact between the portion 34 of the substrate 18 and the portion of the contour of each opening 14 which in this case is the portion distal from the center of rotation of the substrate holder 12. Thus, in the horizontally rotating substrate holder system of the present invention, it is a centrifugal force directed radially, as shown in FIG. 1, which causes the self-rotation of the substrates 18 in the respective openings 14. The geometric principles, presented in previous paragraphs with regard to FIGS. 2 and 3, however, remain the same in the case of the horizontal rotation of the substrate holder as is the case of the vertical rotation of the substrate holder 12.

The portion 34 of the substrate 18 which is self-rotating within the opening 14 during the rotation of the substrate holder 12 continually moves along the contour of the substrate 18, while the portion of the contour of the opening 14 always remains the same, i.e., for vertical rotation the lowermost portion of the contour of the opening 14, and for horizontal rotation, the most distant portion from the center of rotation of the substrate holder 12.

Figure 6:
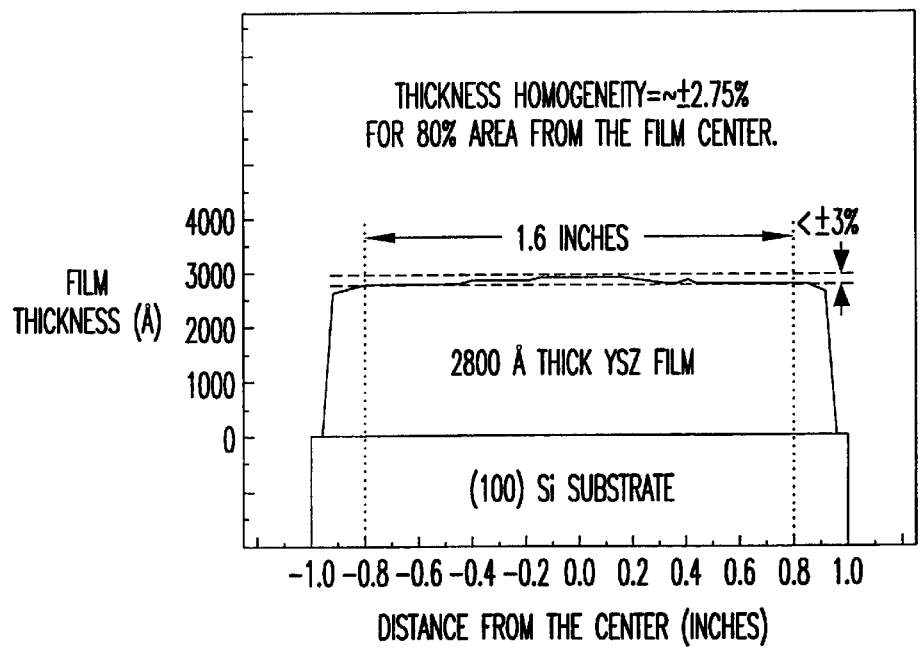

Using the multi-substrate holder system of the present invention, described in previous paragraphs and shown in FIGS. 1, 4, and 5, 2800 Å thick YSZ film was deposited on a 2" in diameter silicon (100) substrate by pulsed laser deposition at 800° C. The YSZ film deposition was performed with a self-planetary multi-substrate holder system 10 without any laser beam scanning. The film thickness homogeneity, as shown in FIG. 6, was about +/−2.75% for 80% of the total film area from the center of the substrate. Less than +/−1.5% of the thickness homogeneity (within 80% of the total area of the substrate) was frequently observed from 3000 Å thick YSZ or $Ba_{0.5}Sr_{0.5}TiO_3$ films deposited on 2" in diameter substrates at 650° C. These results provide sufficient films mass production quality by use of the self-planetary multi-substrate holder system of the present invention.

In the gearless system of the present invention, multiple substrates can be simultaneously self-rotated for material deposition thereon, thus providing the system free of the shortcomings of conventional geared planetary substrate holders, and yielding extended lifetime of the system, increase of the production speed, reducing of the final product cost, and agreeability with the high temperature technological processes.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A planetary multi-substrate holder system for material deposition, comprising:

a substrate holder, said substrate holder having a plurality of circumferentially shaped openings of a first diameter defined therein, means for rotating said substrate holder, a plurality of circularly shaped substrates of a second diameter smaller than said first diameter, each of said substrates being positioned within a respective one of said openings, with a respective portion of the contour of said each substrate maintained in contiguous contact with a respective portion of said respective opening, and means for securing said substrates in said openings, said securing means including a ledge extending in coinciding relationship with the contour of each of said openings, said respective portion of the contour of said each substrate abutting said ledge, said securing means further including a plurality of annularly shaped elements, each attached to a respective one of said openings coaxially therewith, said annularly shaped elements being made of a metal, said holder system further including a magnetic unit positioned at a side of said substrate holder opposite to said annularly shaped elements to secure said annularly shaped elements to said substrate holder, wherein upon application of rotational force from said rotating means towards said substrate holder, each said substrate rotates within said respective opening.

2. The planetary multi-substrate holder system of claim 1, wherein said contiguous contact between said contours of said each substrate and said respective opening is maintained by gravitational force applied to said each substrate.

3. The planetary multi-substrate holder system of claim 1, wherein an axis of rotation of said substrate holder is positioned vertically.

4. The planetary multi-substrate holder system of claim 1, wherein an axis of rotation of said substrate holder is positioned horizontally.

5. The planetary multi-substrate holder system of claim 4, wherein said contiguous contact between said contours of said each substrate and said respective opening is maintained by centrifugal force applied towards said each substrate.

6. The planetary multi-substrate holder system of claim 1, wherein said openings are substantially equidistantly spaced along the circumference of said substrate holder.

7. The planetary multi-substrate holder system of claim 1, wherein said rotating means include a shaft coupled to the center of said substrate holder, and a motor operatively coupled to said shaft.

8. The planetary multi-substrate holder system of claim 1, wherein said substrate holder is a circularly shaped holder having rotational axis thereof passing through the geometrical center thereof.

* * * * *